(12) United States Patent
Takagi

(10) Patent No.: US 6,572,279 B2
(45) Date of Patent: Jun. 3, 2003

(54) LIGHT-EMITTING MODULE

(75) Inventor: Toshio Takagi, Yokohama (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 10/191,518

(22) Filed: Jul. 10, 2002

(65) Prior Publication Data
US 2003/0012525 A1 Jan. 16, 2003

(30) Foreign Application Priority Data
Jul. 11, 2001 (JP) ........................................ 2001-211217

(51) Int. Cl.[7] ................................................. G02B 6/36
(52) U.S. Cl. .............................. 385/92; 385/93; 385/88
(58) Field of Search ............................... 385/92, 93, 88

(56) References Cited
U.S. PATENT DOCUMENTS 4,997,243 A * 3/1991 Aiki et al. ..................... 385/92
6,155,724 A * 12/2000 Ichino et al. .................. 385/92

* cited by examiner

Primary Examiner—Hemang Sanghavi
Assistant Examiner—Eric Wong
(74) Attorney, Agent, or Firm—McDermott, Will & Emery

(57) ABSTRACT

The present invention relates to a light-emitting module employable in optical communications. A light-emitting module 10 comprises a semiconductor light-emitting device 12, a first mounting member 14, a driving device 16, a second mounting member 18, and a housing 20. The first mounting member 14 mounts the light-emitting device 12. The driving device 16 drives the light-emitting device 12. The second mounting member 18 mounts the driving device 16. The housing 20 accommodates the light-emitting device 12, first mounting member 14, driving device 16, and second mounting member 18. The first mounting member 14 and the second mounting member 18 are disposed apart from each other within the housing 20. Since the mounting members are not directly in contact with each other, the heat generated by the driving device 16 is hard to be transmitted to the light-emitting device 12. Therefore, the light-emitting device 12 is restrained from changing its temperature, whereby its output is stabilized.

11 Claims, 4 Drawing Sheets

LIGHT-EMITTING MODULE

BACKGROUND OF THE INVENTION

1. Field of the Invention

The present invention relates to a light-emitting module.

2. Related Background Art

In general, a light-emitting module comprises a semiconductor light-emitting device such as a semiconductor laser, and a housing for accommodating this light-emitting device. The housing has a plurality of lead terminals. By way of these lead terminals, the light-emitting device receives driving signals from the outside of the light-emitting module.

SUMMARY OF THE INVENTION

It is an object of the present invention to provide a light-emitting module for increasing the transmission rate of optical communications.

The inventor has been studying light-emitting modules which can achieve a transmission rate of 10 Gbps or higher. The inventor has found that, for achieving a transmission rate of about 10 Gbps, not only the operating speed of a driving device itself is critical, but also it is important that high-speed modulated signals from the driving device be transmitted to the semiconductor light-emitting device with a small deterioration. Based on this finding, the inventor has come up with the idea of accommodating not only a light-emitting device but also a driving device within a package, and implementing the light-emitting device and driving device close to each other on the same substrate.

When a semiconductor light-emitting device and a driving device are implemented on the same substrate, however, the temperature of the light-emitting device rises 10° C. or more due to the heating of the driving device. This is because of the fact that the driving device consumes a power as high as about 1 W. When the temperature of the light-emitting device changes greatly, the power and oscillating wavelength of the light-emitting device fluctuates. This makes the output characteristic of the light-emitting module unstable.

For stabilizing the temperature of a light-emitting device, a substrate implemented with the light-emitting device may be mounted on a Peltier device. When implementing a driving device and a light-emitting device on the same substrate, it is necessary for the Peltier device to absorb the heat of both the driving and light-emitting devices and control the temperature. To this aim, a large Peltier module with a heat-absorbing capacity of about 1.5 to 2 W is required. This causes the light-emitting module to increase its size.

The light-emitting module in accordance with the present invention comprises a semiconductor light-emitting device; a first mounting member for mounting the light-emitting device; a driving device for driving the light-emitting device; a second mounting member for mounting the driving device; and a housing for accommodating the light-emitting device, first mounting member, driving device, and second mounting member. The first and second mounting members are disposed apart from each other within the housing.

Since not only a light-emitting device but also a driving device is accommodated within a housing, the distance between the light-emitting device and the driving device can be made shorter. In particular, when the first and second mounting members are disposed close to each other, the wiring length can be sufficiently short. As a result, driving signals modulated at a high rate can be transmitted from the driving device to the light-emitting device with a small deterioration. Therefore, the light-emitting module in accordance with the present invention can be used favorably as a light source for high-speed optical communications. Since the first and second mounting members are not directly in contact with each other, the heat generated by the driving device is hard to transmit to the light-emitting device. Hence, the light-emitting device is restrained from changing its temperature, and stabilizes its output.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DETAILED DESCRIPTION OF THE PREFERRED EMBODIMENTS

In the following, an embodiment of the light-emitting module in accordance with the present invention will be explained in detail with reference to the drawings. In the explanation of the drawings, parts identical or equivalent to each other will be referred to with numerals identical to each other without repeating their overlapping descriptions.

Figure 1:
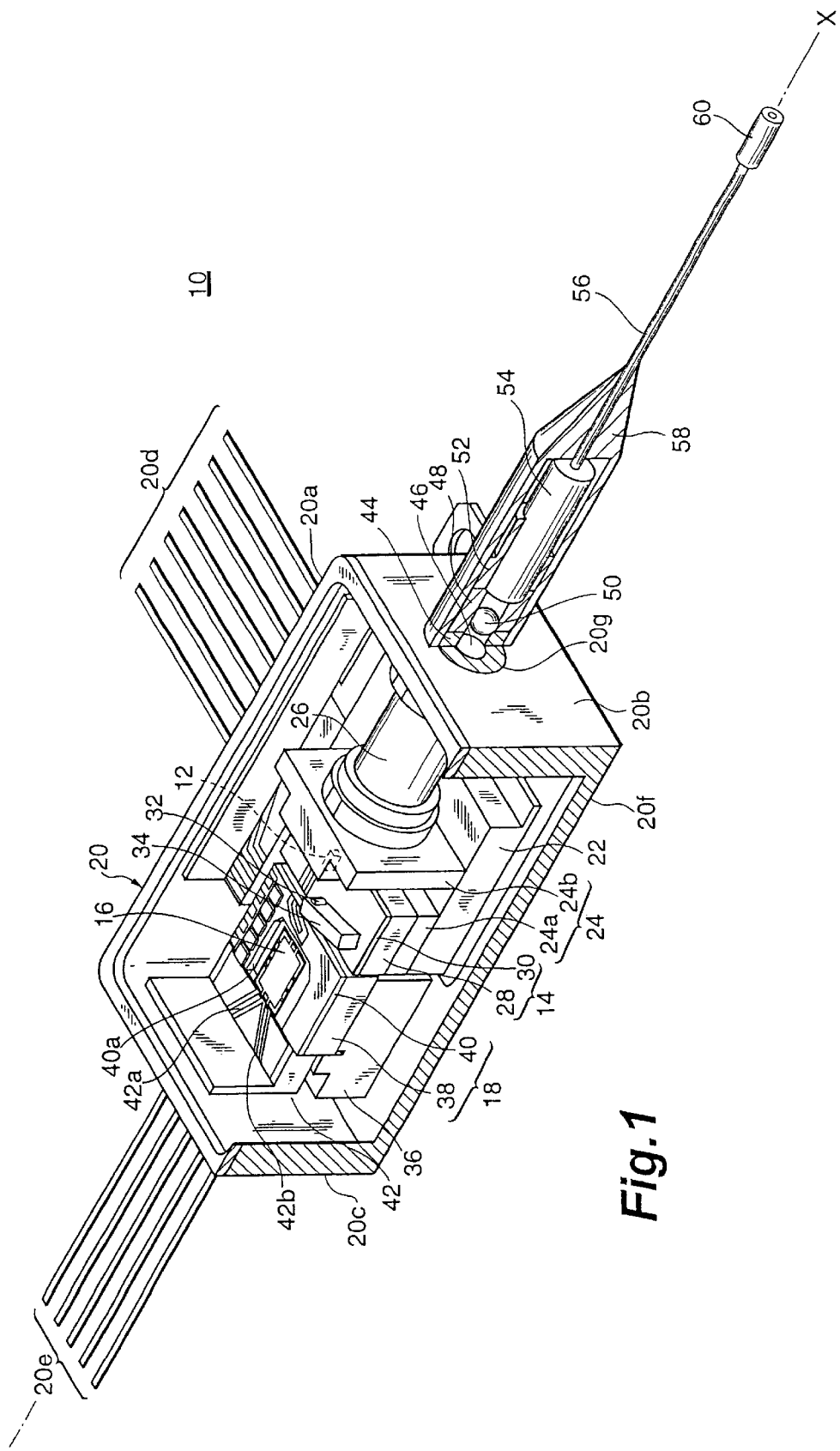
FIG. 1 is a partly broken perspective view showing the light-emitting module in accordance with an embodiment of the present invention.
Figure 2:
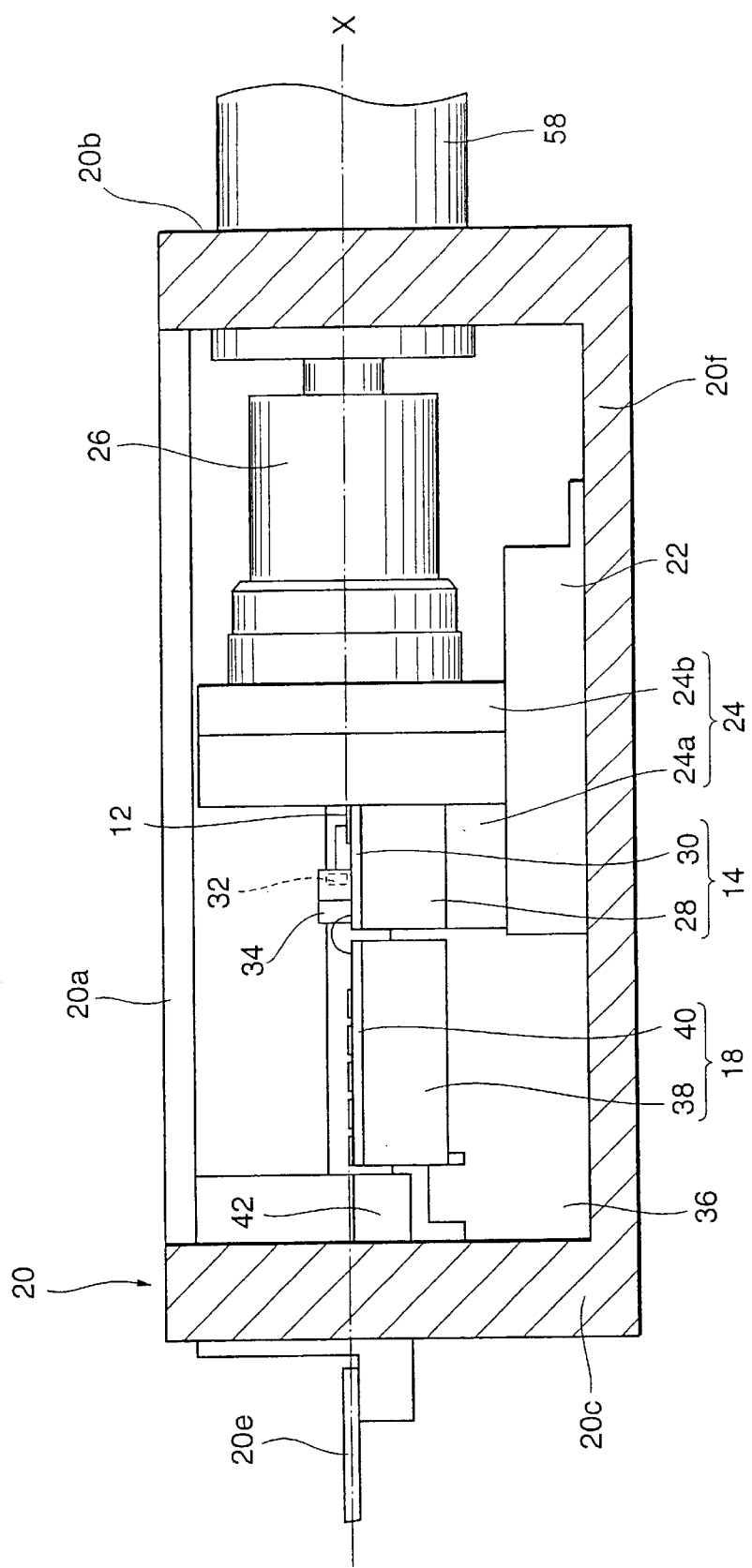
FIG. 2 is a partly broken side view showing the light-emitting module in accordance with the above-mentioned embodiment.
Figure 3:
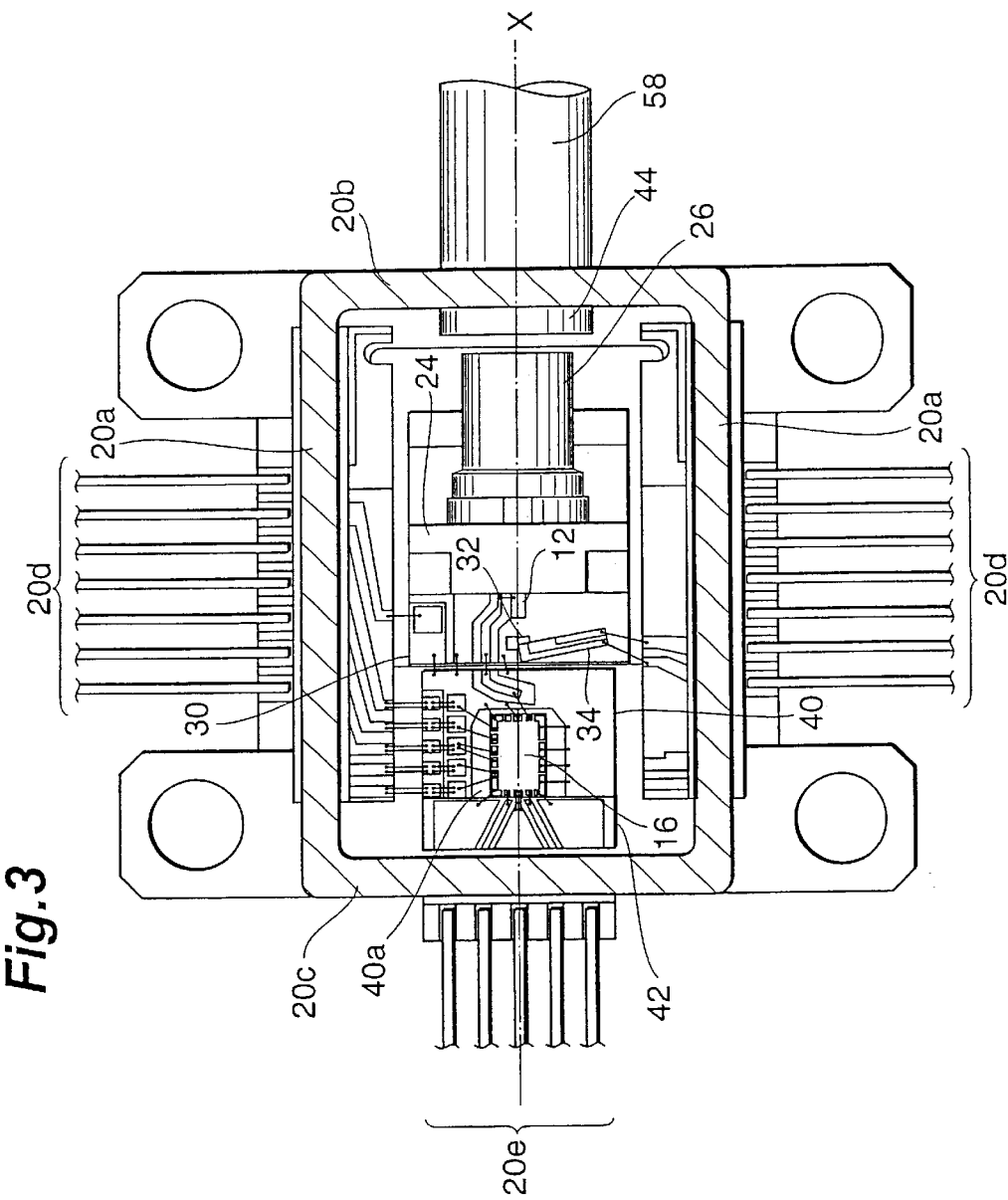
FIG. 3 is a partly broken plan view showing the light-emitting module in accordance with the above-mentioned embodiment.
Figure 4:
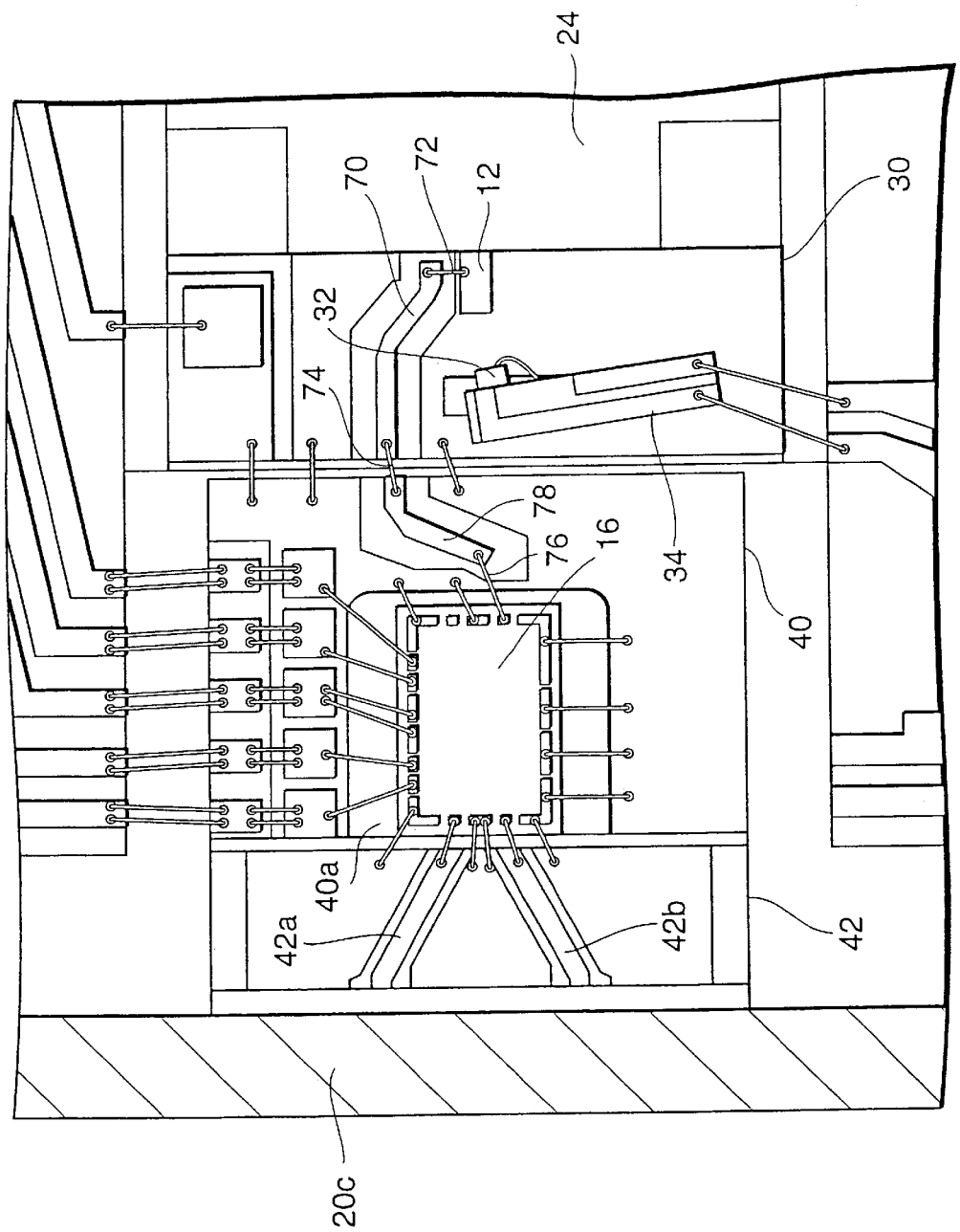
FIG. 4 is an enlarged partly broken plan view showing the upper faces of first and second mounting members.

FIG. 1 is a partly broken perspective view showing the light-emitting module in accordance with this embodiment. FIG. 2 is a partly broken side view showing the light-emitting module. FIG. 3 is a partly broken plan view showing the light-emitting module. FIG. 4 is an enlarged partly broken plan view showing the upper faces of first and second mounting members disposed within the light-emitting module. To simplify the figure, bonding wires are not depicted in FIG. 1.

As shown in FIGS. 1 to 3, the light-emitting module 10 comprises a semiconductor light-emitting device 12, a first mounting member 14, a semiconductor driving device 16, a second mounting member 18, and a housing 20. The light-emitting device 12 is mounted on the first mounting member 14. The driving device 16 is mounted on the second mounting member 18. The housing 20 accommodates the light-emitting device 12, first mounting member 14, driving device 16, and second mounting member 18.

The housing 20 is a so-called butterfly type package. The housing 20 has a pair of side walls 20a extending along an axis X, and a front wall 20b and a rear wall 20c which intersect the axis X. Each of the side walls 20a is provided with a plurality of lead terminals 20d. The rear wall 20c is provided with a plurality of lead terminals 20e. The lead terminals 20d and 20e extend outward from the housing 20. The housing 20 has a bottom wall 20f and an upper wall which extend along the axis X. For convenience of illustration, the upper wall is not depicted in any of FIGS. 1 to 4. The bottom wall 20f is constituted by a metal exhibiting a favorable thermal conductivity, e.g., CuW. The side walls 20a, front wall 20b, rear wall 20c, and upper wall are constituted by a metal such as Kovar (TM).

In the upper face (mounting face) of the bottom wall 20f of the housing 20, a Peltier device 22 is placed at a part near the front wall 20b. The Peltier device 22 is electrically connected to the lead terminals 20d. The Peltier device 22 exhibits a heat-generating or heat-absorbing effect when a current is supplied thereto by way of the lead terminals 20d. On the Peltier device 22, an L carrier 24 is mounted. The L carrier 24 is constituted by a material excellent in thermal conductivity, e.g., CuW. The L carrier 24 has a mounting part 24a and a lens supporting part 24b. The lens supporting part 24b supports a first lens holding member 26. The first lens holding member 26 holds a first lens which is not depicted.

The first mounting member 14 is mounted on the mounting part 24a of the L carrier 24. The first mounting member 14 has a first carrier 28 and a first wiring substrate 30. The first carrier 28 is constituted by a material excellent in thermal conductivity, e.g., CuW. The first wiring substrate 30 is constituted by an electrically insulating material, e.g., AlN.

The semiconductor light-emitting device 12 is mounted on the first wiring substrate 30. The first wiring substrate 30 has a surface transmission line 70, as shown in FIG. 4. The surface transmission line 70 extends from near the light-emitting device 12 to an edge of the first wiring substrate 30. The surface transmission line 70 and the light-emitting device 12 are wire-bonded to each other by a wire 72. In response to a driving signal sent from the driving device 16, the light-emitting device 12 generates modulated light. The light-emitting device 12 receives the driving signal by way of the surface transmission line 70 and wire 72. As the light-emitting device 12, a semiconductor laser device can be used, for example.

The temperature of the light-emitting device 12 is controlled by the Peltier device 22. The light-emitting device 12 and the Peltier device 22 are thermally connected to each other by way of the first wiring substrate 30, first carrier 28, and L carrier 24. The light-emitting device 12 has a light-emitting face and a light-reflecting face which are disposed opposite from each other. The light-emitting face of the light-emitting device 12 opposes the first lens (not depicted) held by the first lens support member 26.

A monitor light-receiving device 32 is mounted on the first wiring substrate 30, and is held on a side face of a holder 34. The light-receiving face of the light-receiving device 32 is optically coupled to the light-reflecting face of the light-emitting device 12. The light-emitting device 32 receives the light leaking from the light-reflecting face of the light-emitting device 12, thereby monitoring the light-emitting state of the light-emitting device 12. Employable as the light-receiving device 32 is a device which can convert light into a current, e.g., photodiode.

In the upper face (mounting face) of the bottom wall 20f of the housing 20, a spacer 36 is placed at a part near the rear wall 20c. As with the bottom wall 20f, the spacer 36 is constituted by a metal exhibiting a favorable thermal conductivity, e.g., CuW.

The second mounting member 18 is directly mounted on the spacer 36. The second mounting member 18 has a second carrier 38 and a second wiring substrate 40. The second carrier 38 is constituted by a material excellent in thermal conductivity, e.g., CuW. The second wiring substrate 40 is mounted on the second carrier 38. The second wiring substrate 40 is formed with a cutout 40a. The second wiring substrate 40 has a surface transmission line 78, as shown in FIG. 4. The surface transmission line 78 extends from near the cutout 40a to an edge of the second wiring substrate 40. The surface transmission line 78 faces the surface transmission line 72 of the first wiring substrate 30.

The driving device 16 is directly mounted on the second carrier 38, and is disposed within the cutout 40a of the second wiring substrate 40. As a result, the upper face of the driving device 16 and the upper face of the second wiring substrate 40 are substantially flush with each other. The surface transmission line 78 and the driving device 16 are wire-bonded to each other with a wire 76. Since the upper face of the driving device 16 and the upper face of the second wiring device 40 are substantially flush with each other, the wiring length of wire bonding, e.g., the length of wire 76 can be short.

The driving device 16 is electrically connected to the lead terminals 20e. The driving device 16 receives a modulation signal from the outside of the light-emitting module 10 by way of the lead terminals 20e. The modulation signal is a signal for modulating the light-emitting device 12. The driving device 16 amplifies the modulation signal and generates a driving signal. The driving signal is transmitted to the light-emitting device 12 by way of the wire 76 and surface transmission line 78.

The second mounting member 18 mounting the driving device 16 is disposed so as to oppose the light-reflecting face of the light-emitting device 12. This intends not to inhibit the light emitted from the light-emitting face of the light-emitting device 12 from advancing.

The first mounting member 14 mounted with the light-emitting device 12 and the second mounting member 18 mounted with the driving device 16 are arranged with a predetermined gap therebetween not to be in contact with each other. As shown in FIG. 4, the surface transmission line 70 of the first wiring substrate 30 and the surface transmission line 78 of the second wiring substrate 40 are wire-bonded to each other with a wire 74. As a result, the light-emitting device 12 and the driving device 16 are electrically connected to each other. The driving signal from the driving device 16 successively travels the wire 76, surface transmission line 78, wire 74, surface transmission line 70, and wire 72, so as to be supplied to the light-emitting device 12.

Experiments conducted by the inventor have proved it advantageous for the distance between the driving device 16 and light-emitting device 12 to be shorter in order to achieve high-speed transmissions. The distance can be set optionally. For achieving a transmission speed of 10 Gbps, it is preferred that the distance be 4 mm or less. In optical modules using high-speed modulation signals, it is preferred that the bonding wire be short. This is because of the fact that impedance matching of modulation signals is harder to achieve when the bonding wire is longer. In the light-emitting module 10 in accordance with this embodiment, the distance between the first mounting member 14 and second mounting member 18 is 0.1 mm so that the bonding wire 74 connecting the first mounting member 14 to the second mounting member 18 is sufficiently short.

The upper face of the first wiring substrate 30 and the upper face of the second wiring substrate 40 are substantially flush with each other. This also contributes to shortening the length of the bonding wire 74 connecting them.

On the spacer 36, a third wiring substrate 42 is mounted adjacent the second wiring substrate 40. A pair of transmission lines 42a and 42b are disposed on the third wiring substrate 42. The transmission lines 42a and 42b extend from one of two opposing sides of the third wiring substrate 42 to the other. Conductive layers are disposed between the transmission lines 42a and 42b. The conductive layers are connected to a grounding potential line. One end of each of the transmission lines 42a, 42b is connected to the driving device 16 by wire-bonding. The other end of each of the transmission lines 42a, 42b is connected to its corresponding lead line 20e. The driving device 16 can receive the modulation signal from the outside of the light-emitting module 10 by way of the lead terminals 20e and transmission lines 42a, 42b.

The front wall 20b of the housing 20 faces the lens supporting part 24b of the L carrier 24. The front wall 20b is provided with a through hole 20g. Light from the light-emitting device 12 passes through the hole 20g. As shown in FIGS. 1 and 2, a tubular holding member 44 passes through the hole 20g, thus projecting from both ends of the hole 20g. The hollow part of the holding member 44 holds a hermetic glass sheet 46. A second lens holding member 48 is disposed at the front end of the holding member 44. The second lens holding member 48 has a tubular form. The front end face of the holding member 44 abuts against the rear end face of the second lens holding member 48. The hollow part of the second lens holding member 48 holds a second lens 50. The second lens 50 is a condenser lens, for example. A ferrule holder 52 is disposed at the front end of the second lens holding member 48. The ferrule holder 52 has a hole for accommodating a ferrule 54. An optical fiber 56 is inserted in the ferrule 54 so that one end part thereof is protected thereby. The optical fiber 56 is aligned with respect to the second lens 50 by way of the ferrule 54 and ferrule holder 52. As a result, light from the light-emitting device 12 can enter one end of the optical fiber 56.

A protective member 58 covers the holding member 44, second lens holding member 48, ferrule holder 52, and ferrule 54. The protective member 58 covers a part of the optical fiber 56 as well. A cap of rubber can be used as the protective member 58. An optical coupling device 60 such as an optical connector is attached to a leading end of the optical fiber 56. The coupling device 60 optically couples the fiber 56 to another optical component. The light from the light-emitting device 12 propagating through the fiber 56 is supplied to the optical component by way of the coupling device 60. The coupling device 60 may include a ferrule accommodating the leading end of the fiber 56.

Operations and effects of the light-emitting module 10 will now be explained.

When a modulation signal is fed into the driving device 16 from the outside of the light-emitting module 10 by way of the lead terminals 20e, the driving device 16 amplifies the modulation signal, thereby generating a driving signal. The driving signal is supplied to the light-emitting device 12 by way of the bonding wire 76, surface transmission line 78 of the second wiring substrate 40, bonding wire 74, surface transmission line 70 of the first wiring substrate 30, and bonding wire 72.

In response to the driving signal, the light-emitting device 12 emits light with a predetermined wavelength from the light-emitting face with a predetermined power. The light emitted from the light-emitting face is collimated by the first lens (not depicted) held by the first lens holding member 26. The collimated light passes through the hermetic glass sheet 46, thereby reaching the second lens 50. This light is condensed by the second lens 50 to enter one end of the fiber 56 accommodated in the ferrule 54. The light propagates through the fiber 56, thereby reaching the optical coupling device 60 disposed at the other end of the fiber 56.

The monitor light-receiving device 32 receives the light leaking from the light-reflecting face of the light-emitting device 12. The output of the monitor light-receiving device 32 is used for feedback control of the output light from the light-emitting device 12. This feedback control stabilizes the output wavelength and output power of the light-emitting device 12.

While the light-emitting module 10 is operating, the driving device 16 and light-emitting device 12 generate heat. Since the driving device 16 is directly mounted on the second carrier 38 of the second mounting member 18, the heat generated from the driving device 16 propagates through the second carrier 38, thereby reaching the bottom wall 20f of the housing and dissipating therefrom. Thus, since the driving device 16 is directly mounted on the second carrier 38, its heat-dissipating characteristic is improved. On the other hand, the heat generated from the light-emitting device 12 propagates through the first wiring substrate 30, first carrier 28, and L carrier 24, so as to be absorbed by the Peltier device 22.

Since both of the light-emitting device 12 and driving device 16 are accommodated within the housing 20, the distance between the light-emitting device 12 and the driving device 16 can be shortened. In particular, the bonding wire 74 can be short if the distance between the first mounting member 14 and the second mounting member 18 is short enough. In conformity thereto, the wiring length between the light-emitting device 12 and the driving device 16 can be sufficiently short. As a result, driving signals modulated at a high rate can be transmitted from the driving device 16 to the light-emitting device 12 with a small deterioration. Therefore, the transmission rate can be increased if the light-emitting module 10 is used in optical communications.

The heat generated from the driving device 16 is hard to transmit to the light-emitting device 12. This is because that an air gap exists between the first mounting member 14 mounted with the light-emitting device 12 and the second mounting member 18 mounted with the driving device 16. As a result, the heat generated from the driving device 16 is not transmitted to the light-emitting device 12 by way of the first and second wiring substrates 30, 40 or first or second carrier 28, 38. Therefore, the heat generated from the driving device 16 can be restrained from being transmitted to the light-emitting device 12. Thus, in this embodiment, the change in the temperature of the light-emitting device 12 is suppressed to stabilize the output of the light-emitting device 12 by placing the light-emitting device 12 and driving device 16 on the first and second mounting members 14, 18 separated from each other, respectively.

In this embodiment, the light-emitting device 12 is mounted on the bottom wall 20f of the housing 20 by way of the Peltier device 22. This makes it easier to control the temperature of the light-emitting device 12. As a result, the output characteristic of the light-emitting module 10 can further be stabilized.

Since the first mounting member 14 and the second mounting member 18 are separated from each other, no large Peltier module is necessary for controlling the temperature of both the light-emitting device 12 and driving device 16. This can prevent the light-emitting module 10 from becoming larger.

The present invention is not limited to the above-mentioned embodiment. The present invention can be modified in various manners. For example, in the light-emitting module 10 of the above-mentioned embodiment, another Peltier device may be disposed between the second mounting member 18 and the bottom wall 20f of the housing 20.

From the invention thus described, it will be obvious that the embodiments of the invention may be varied in many ways. Such variations are not to be regarded as a departure from the spirit and scope of the invention, and all such modifications as would be obvious to one skilled in the art are intended for inclusion within the scope of the following claims.

What is claimed is:

1. A light-emitting module comprising:
   a semiconductor light-emitting device;
   a first mounting member for mounting said light-emitting device;
   a driving device for driving said light-emitting device;
   a second mounting member for mounting said driving device; and
   a housing for accommodating said light-emitting device, said first mounting member, said driving device, and said second mounting member:
   wherein said first and second mounting members are disposed apart from each other within said housing,
   wherein said first mounting member has a first wiring substrate and a first metal carrier for mounting said first wiring substrate;
   wherein said light-emitting device is placed on said first wiring substrate;
   wherein said second mounting member has a second wiring substrate and a second metal carrier for mounting said second wiring substrate; and
   wherein said driving device is placed on said second carrier.

2. A light-emitting module according to claim 1, wherein said first wiring substrate has a first surface transmission line extending from near said light-emitting device to an edge of said first wiring substrate;
   wherein said light-emitting device is wire-bonded to said first surface transmission line;
   wherein said second wiring substrate has a second surface transmission line extending from near said light-emitting device to an edge of said second wiring substrate;
   wherein said driving device is wire-bonded to said second surface transmission line; and
   wherein said first and second surface transmission lines are wire-bonded to each other.

3. A light-emitting module according to claim 1, wherein said first and second wiring substrates have respective upper faces substantially flush with each other.

4. A light-emitting module according to claim 1, wherein said second wiring substrate has a cutout, said driving device being disposed within said cutout.

5. A light-emitting module according to claim 4, wherein said wiring substrate and said driving device have respective upper faces substantially flush with each other.

6. A light-emitting module according to claim 1, wherein said housing has a mounting face on which said first and second mounting members are placed;
   wherein a Peltier device is placed in a portion of said mounting face; and
   wherein said first mounting member is disposed on said Peltier device.

7. A light-emitting module according to claim 6, wherein said light-emitting module further comprises a lead terminal extending outward from said housing; and
   wherein said lead terminal is electrically connected to said Peltier device.

8. A light-emitting module according to claim 6, wherein a spacer is placed in another portion of said mounting face;
   wherein said second mounting member is placed on said spacer;
   wherein said light-emitting module further comprises a third wiring substrate;
   wherein said third wiring substrate is disposed adjacent said second wiring substrate on said spacer;
   wherein said third wiring substrate has a transmission line; and
   wherein one end of said transmission line is wire-bonded to said driving device.

9. A light-emitting module according to claim 8, wherein said light-emitting module further comprises a lead terminal extending outward from said housing; and
   wherein the other end of said transmission line is connected to said lead terminal.

10. A light-emitting module according to claim 9, wherein said driving device is adapted to receive a modulated signal by way of said lead terminal and said transmission line; and
    wherein said driving device generates a driving signal for said light-emitting device in response to said modulated signal, and supplies said driving signal to said light-emitting device.

11. A light-emitting module according to claim 1, wherein a light-receiving device for monitoring said light-emitting device is placed on said first wiring substrate.

* * * * *